United States Patent [19]

Akiya

[11] Patent Number: 4,665,423
[45] Date of Patent: May 12, 1987

[54] MIS VARIABLE RESISTOR

[75] Inventor: Masahiro Akiya, Mitakashi, Japan

[73] Assignee: Nippon Telegraph and Telephone Public Corporation, Tokyo, Japan

[21] Appl. No.: 783,063

[22] Filed: Oct. 2, 1985

Related U.S. Application Data

[63] Continuation of Ser. No. 410,892, Aug. 24, 1985, abandoned.

[30] Foreign Application Priority Data

Sep. 5, 1981 [JP] Japan ................................ 56-140175

[51] Int. Cl.[4] ....................... H01L 29/78; H01L 27/02
[52] U.S. Cl. ........................................ 357/23.1; 357/41
[58] Field of Search ................ 357/41, 51, 23.1, 23.12

[56] References Cited

U.S. PATENT DOCUMENTS 3,374,406 3/1968 Wallmark .......................... 357/23.12
3,430,112 2/1969 Hilbourne ......................... 357/23.12

Primary Examiner—Andrew J. James
Assistant Examiner—Mark Prenty
Attorney, Agent, or Firm—Cushman, Darby & Cushman

[57] ABSTRACT

This invention concerns a voltage control type variable resistor using a metal oxide semiconductor (MOS) and other metal insulated semiconductors (MIS) wherein an offset gate MIS transistor having smaller threshold voltage and a self-aligned gate MIS transistor having a larger threshold voltage than that of said offset gate MIS transistor in absolute value are formed in parallel on one insulated substrate. The sources, the drains and the gates of both transistors are connected in common. A voltage control type MIS variable resistor described above, can be improved to have a wider linear range of resistance and voltage.

9 Claims, 13 Drawing Figures

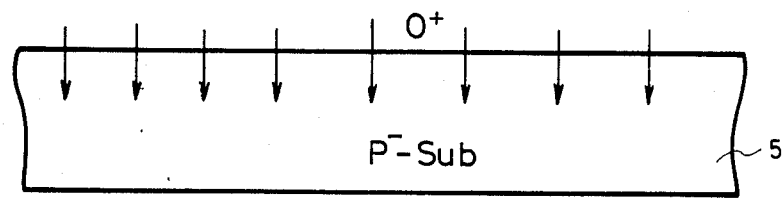
Fig 9-A
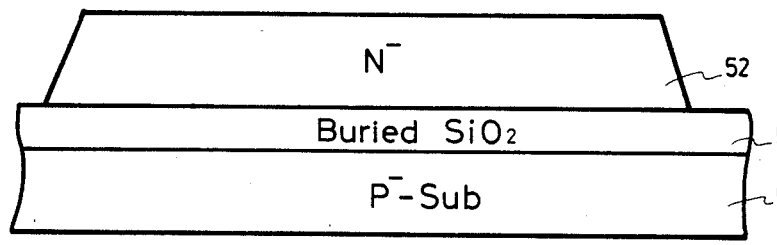
Fig 9-B
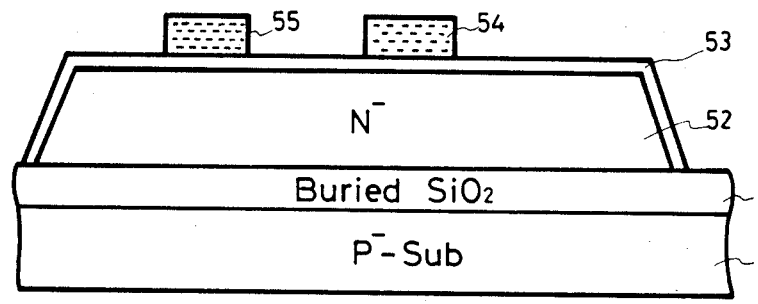
Fig 9-C
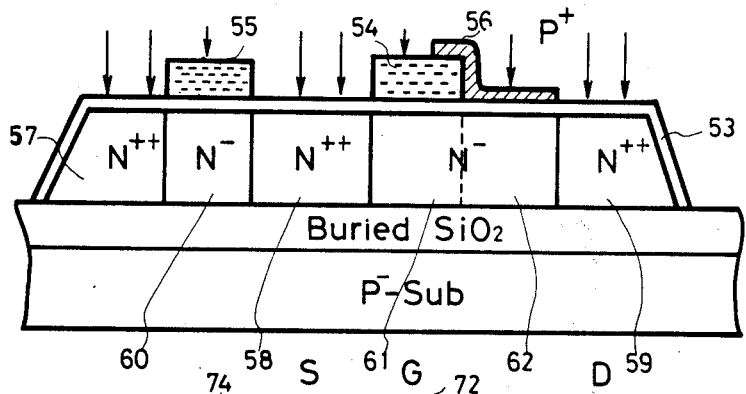
Fig 9-D
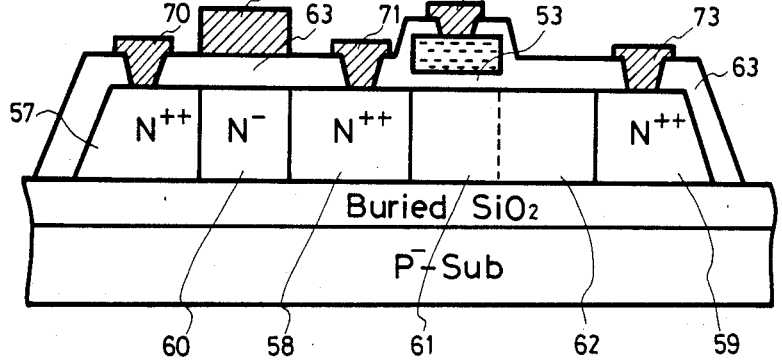
Fig 9-E

MIS VARIABLE RESISTOR

This is a continuation, of application Ser. No. 410,892, filed Aug. 24, 1985, which was abandoned upon the filing hereof.

TECHNICAL FIELD OF THE INVENTION

The present invention relates to an improvement on a voltage control type variable resistor using a metal insulated semiconductor (which is referred to as MIS hereinafter) and more particularly to an improvement on the linearity of such a voltage control type variable resistor.

BACKGROUND OF THE INVENTION

A voltage control type variable resistor using MIS (which is referred to as MIS variable resistor herein) by conventional art is shown in FIG. 1. There has been proposed such a structure, for instance, that semiconductor regions 3 and 4 of N+ type are formed from the surface 2 into a semiconductor substrate 1 of p type, an electrode 7 is placed on an insulated layer 6 from the side of the surface 2 on a region 5 between the regions 3 and 4 of the semiconductor, and the region 3 is connected with the substrate 1 to be lead out at a terminal 8 while the region 4 and the electrode 7 are lead out at terminals 9 and 10 respectively.

In an MIS variable resistor having such a construction using the semiconductor substrate 1, the semiconductor region 3 is used as a source S, the region 4 as a drain D, the region 5 as a channel region, the insulated layer 6 as a gate insulated film and the electrode 7 as a gate G By constructing in the manner above, there is formed what is called the self-aligned gate MIS transistor Q. If the terminals 8 and 10 are used as the control terminals, a variable voltage source 11 is connected therebetween, i.e. between the source S and the gate G, and if the voltage of the variable voltage source 11 is varied, a resistance corresponding to the voltage of the variable voltage source 11 exists between the resistance terminal 8 and 9 or, between the source S and the drain D. The MIS variable resistor functions as a variable resistor of the voltage control type in the above mentioned manner.

In the case of prior art MIS variable resistors, however, when a reverse voltage with the positive side on the source S is applied between the terminals 8 and 9 or between the source S and the drain D, because the PN junction 12 between the drain D and the semiconductor substrate 1 is biased to the forward direction, an electric current flows through the PN junction 12. The value on the negative side of the voltage $V_D$ of the drain D based upon the source S is therefore limited to be an extremely small value, for instance, about $-0.7$ V in order to prevent such current. In FIG. 2, the drain voltage is plotted on the abscissa while the drain current is plotted on the ordinate. The solid line shows the resistance value in the case where a control voltage is applied to the control terminals 10 and 8 as to make the resistance small between the resistance terminals 8 and 9 while the dot-and-chain shows the resistance value in the case where the control voltage is applied thereto so as to make the resistance larger.

As is obvious from FIG. 2, the prior art device is defective in that it is not applicable over a wider range of drain voltages $V_D$.

As the MIS transistor Q is of the self-aligned type in the conventional MIS variable resistor shown in FIG. 1, the linear region characteristics of the drain current $I_D$ against the drain voltage $V_D'$ especially when a larger resistance value is obtained, is extremely limited, and therefore the applicable region of the resistor or the dynamic range thereof is inconveniently narrow.

OBJECTS OF THE INVENTION

The present invention aims to provide a voltage control type MIS variable resistor which is capable of realizing a linear resistance characteristic over a wider range of resistance values.

Another object of the present invention is to provide a voltage control type MIS variable resistor i.e., wherein the can be used for a wider drain voltage range.

Still another object of the present invention is to provide a voltage control type MIS variable resistor which resistance is kept constant even if the amplitude of the signal applied to the resistance increases or in other words, dynamic range for such signals is larger.

Still another object of the present invention is to provide a voltage control type MIS variable resistor which is suitable for an integrated circuit.

Still another object of the present invention is to provide a voltage control type MIS variable resistor which can effectively operate as a resistance even during high frequency operation.

DEFINITION

In this specification, a "self-aligned gate MIS transistor" means an MIS transistor where the channel region and drain region are in approximation. An "offset gate MIS transistor" means the MIS transistor where the channel region is separated physically bay an offset region from the drain region.

SHORT STATEMENT OF THE INVENTION

The MIS variable resistor according to the present invention comprises an MIS, a pair of control terminals connected to the MIS, and a pair of resistance terminals connected to the MIS wherein the resistance values appeared at the resistance terminals are varied by the voltage applied to the control terminals, and is characterized in that the MIS includes an offset gate MIS transistor and a self-aligned gate MIS transistor having a threshold voltage difference of the offset gate MIS transistor wherein the gates, the drains and the sources of the two transistors are connected to each other, respectively. The gates and the sources thereof are lead to the control terminals and the drain and the source thereof are lead to the resistance terminals.

In the present invention, the absolute value of the threshold voltage of the self-aligned gate MIS transistor is larger than that of the offset gate MIS transistor. The two transistors are constructed so that they have either a common source or a common drain on an insulated substrate.

The two transistors may be constructed so that the thickness of the insulated layers are different to make the respective threshold voltage different.

The threshold voltage of the self-aligned gate MIS transistor may be set at a value substantially similar to the gate voltage which minimizes the resistance value between the drain and the source of the offset gate MIS transistor.

The MIS transistor may be a metal oxide insulated semiconductor transistor.

In the case of the MIS variable resistor using a P-channel MIS transistor, it is desirable to set the threshold voltage of the offset gate MIS transistor at about −1.4 V and the threshold voltage of the self-aligned gate MIS transistor at about −2.7 V.

BRIEF DESCRIPTION OF THE DRAWINGS

FIG. 9 briefly shows a fabrication process diagram of an MIS variable resistor using an N-channel MIS Transistor.

DESCRIPTION OF THE PREFERRED EMBODIMENTS

The device according to the present invention will now be described in detail referring to the preferred embodiments. The description is to facilitate understanding of the present invention but is not to impose any restrictions on the present invention in any way.

Figure 3:
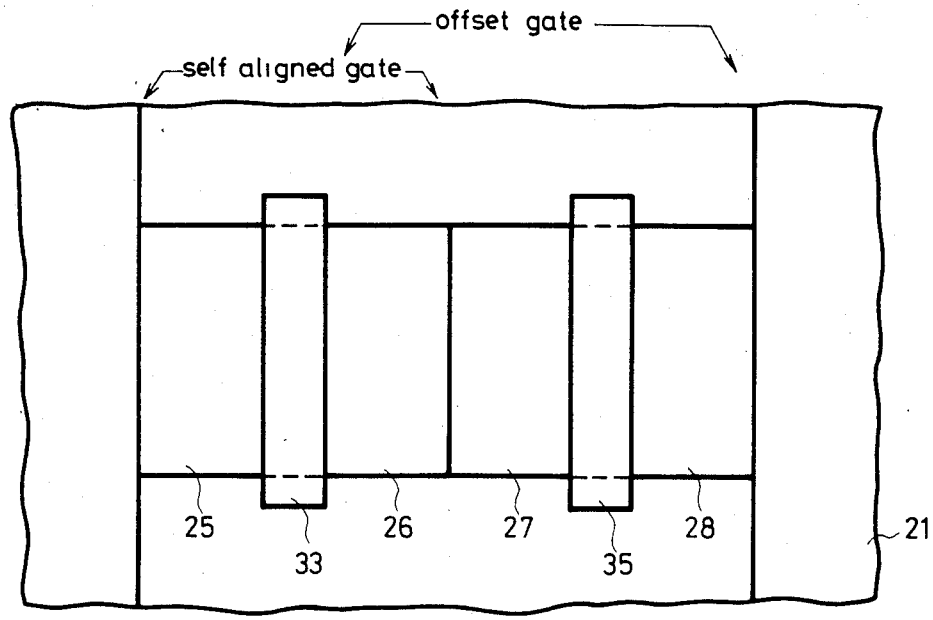
FIG. 3 is a plain view showing the structure of an embodiment of the MIS variable resistor according to the present invention.
Figure 4:
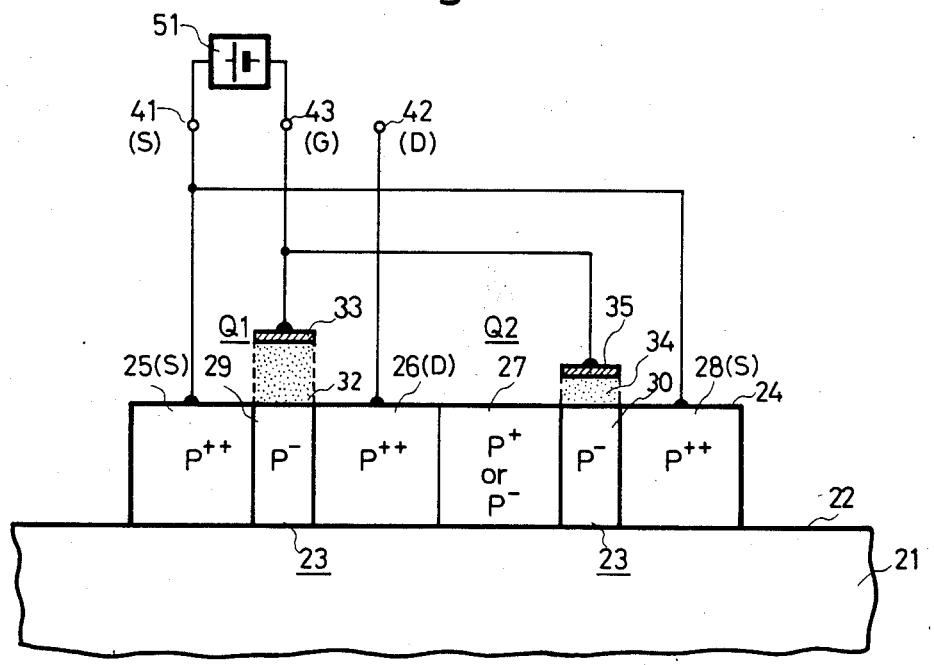
FIG. 4 is a cross sectional view to show the structure of the MIS variable resistor according to the present invention.

FIGS. 3 and 4 indicate the structures of the first embodiment of the MIS variable resistor according to the present invention. The device has an insulated substrate 21 having a surface 22 on which is formed a P− type semiconductor layer 23 in the form of an island whose impurity concentration is less than about $10^{16}$ cm$^{-3}$. Inside the semiconductor layer 23, from the surface thereof 24, a P++ type semiconductor region 25, whose impurity is more than about $10^{19}$cm$^{-3}$, a P++ type semiconductor region 26, a P+ type or P− type semiconductor region 27, whose impurity is between about $10^{16}$cm$^{-3}$ and $10^{19}$cm$^{-3}$, and a P++ type semiconductor region 28 are formed in that order to the depth of the insulated substrate 21. A semiconductor region 29 made of the semiconductor layer 23 remains between the semiconductor regions 25 and 26 while the semiconductor region 30 made of the semiconductor layer 23 remains between the regions 27 and 28. The semiconductor regions 26 and 27 are adjacent to each other. The semiconductor region 27 may be the region to form a part of the semiconductor layer 23 if it is of the P− type.

An electrode 33 is provided on the semiconductor region 29 from the side of the surface 24 via an insulated layer 32 and an electrode 35 is provided on the semiconductor region 30 from the surface 24 via an insulated layer 34.

The semiconductor regions 25 and 28 are electrically connected to each other to be lead out to a terminal 41. A semiconductor region 26 is lead out to a terminal 42, and electrodes 33 and 35 are electrically connected to each other to be lead out to a terminal 43.

There describes an embodiment of the structure of an MIS variable resistor wherein an insulated substrate 21 is used to construct a self-aligned gate MIS transistor Q1 which uses the semiconductor regions 25 and 26 as the source S and the drain D, respectively, the semiconductor region 29 as the channel region, the insulated layer 32 as the gate insulated film, and the electrode 33 as a gate G and an offset gate MIS transistor Q2 which uses semiconductor regions 28 and 26 as the source S and the drain D, respectively, the semiconductor region 30 as a channel region, the semiconductor region 27 as an offset region, the insulated layer 34 as a gate insulated film and the electrode 35 as a gate G. If a variable voltage source 51 is connected between the terminals 41 and 43 or between the source S and the gate G of the transistors Q1 and Q2, and the voltage from the voltage source 51 is varied, a resistance corresponding to the voltage of the variable voltage source 51 appears between the terminals 41 and 42 or the source S and the drain D of the transistors Q1 and Q2. The device therefore operates as a variable resistor.

Figure 5:
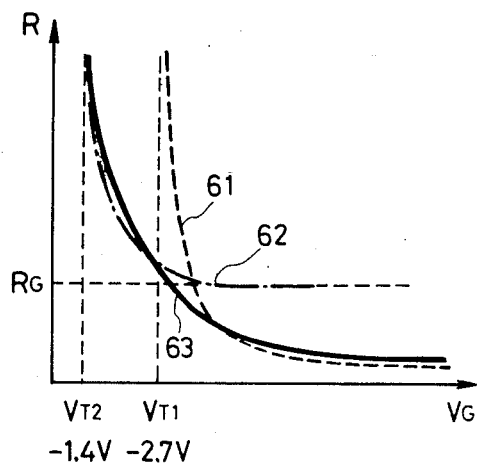
FIGS. 5, 6 and 7 show electric characteristics of the MIS variable resistor embodying the present invention, wherein FIG. 5 indicates the resistance characteristics against the gate voltage, FIG. 6 the drain current against the drain voltage and FIG. 7 a distortion value against the drain voltage (signal/distortion value).

In the case of the device according to the present invention indicated in FIGS. 3 and 4, it has the function of a variable resistor wherein the relation between the threshold voltage $V_{t1}$ of the self-aligned gate MIS transistor Q1 and the threshold voltage $V_{t2}$ of the offset gate MIS rransistor Q2 is set at $|V_{t1}| > |V_{t2}|$. For instance, the thickness $T_1$ of the insulated layer 32 of the transistor Q1 is selected to be larger than the thickness $T_2$ of the insulated layer 34 of the transistor Q2. As to the transistor Q1, if the relation between the voltage $V_G$ of the terminal 43 or the gate G on the base of the terminal 41 or the source S and the resistance R between terminal 41 or the source S and the terminal 42 or the drain D is obtained as indicated by the curve 61 of FIG. 5, the relation between the gate voltage $V_G$ and the resistance R similarly for the transistor Q2 will become as shown by the curve 62 in FIG. 5. The relation between the gate voltage $V_G$ and the resistance R when combined will become as indicated by the curve 63 in FIG. 5.

Accordingly in the case of the variable resistor which embodies the present invention as shown in FIGS. 3 and 4, if the threshold voltage $V_{t1}$ of the transistor Q1 is set at a value substantially identical to the gate voltage $V_g$ from which the minimum value of the resistance R for the transistor Q2 (that value is substantially corresponds to the resistance value of the semiconductor region 27 which comprises the offset region) is obtainable, the resistance R can be varied for a wider range for the gate voltage $V_g$ in a linear region and within a wider resistance range.

Figure 6:
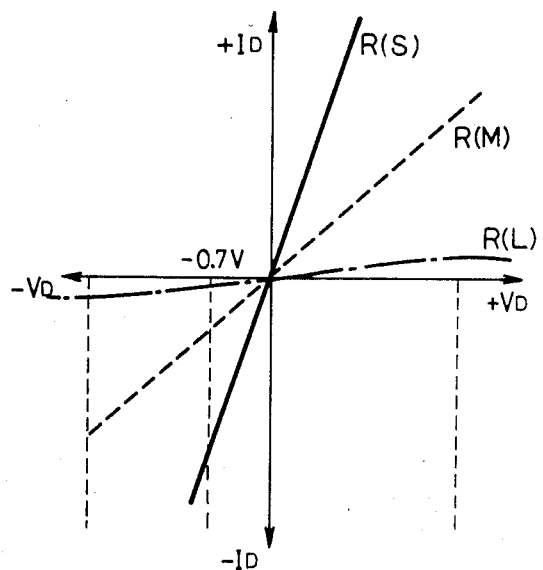

In the case of the variable resistor according to the present invention indicated in FIGS. 3 and 4, since both transistors Q1 and Q2 are formed on the insulated substrate 21, even if the voltage $V_D$ of the terminal 42 or the drain D has a negative polarity with respect to the source S, electric current does not flow through the substrate. Even if the value of the drain voltage $V_D$ is negative, therefore the linear region is not restricted by the diffusion potential as was the case in prior art but can be made larger than that of prior art. That is quite obvious from the relation between the drain voltage $V_D$ having the resistance R shown in FIG. 6 as a parameter and the current $I_D$ flowing through the drain D.

In the case of the variable resistor indicated in, FIGS. 3 and 4, therefore, it can be used for a wider drain voltage $V_D$ than the prior art.

Figure 1:
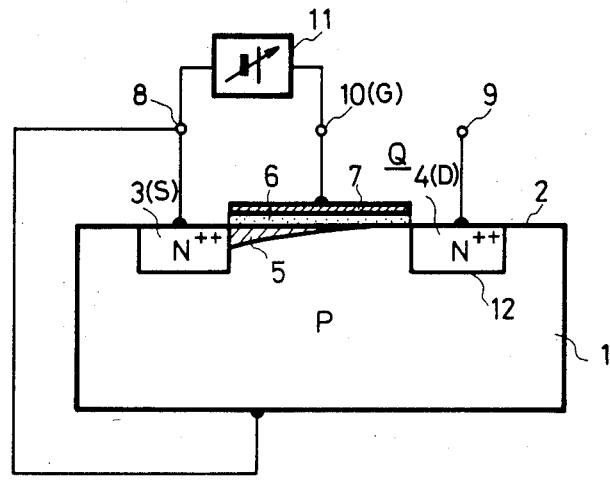
FIG. 1 is a cross sectional view showing the structure of an MIS variable resistor of prior art.
Figure 2:
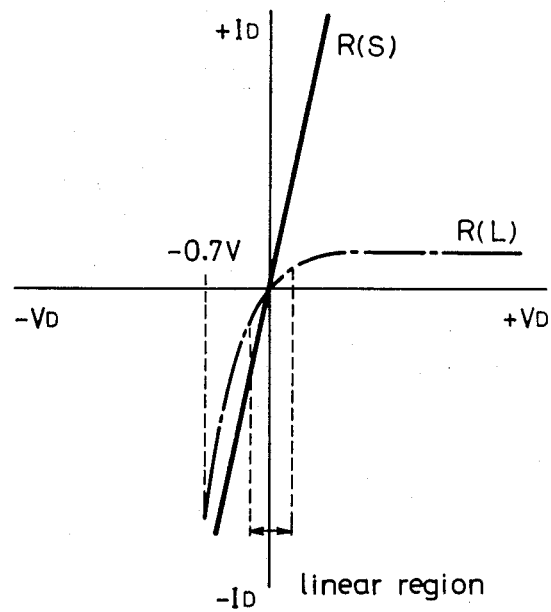
FIG. 2 is a graph showing the voltage-current characteristics of the MIS variable resistor of the prior art wherein the drain voltage is plotted on the abscissa, while the drain current is plotted on the ordinate.
Figure 7:
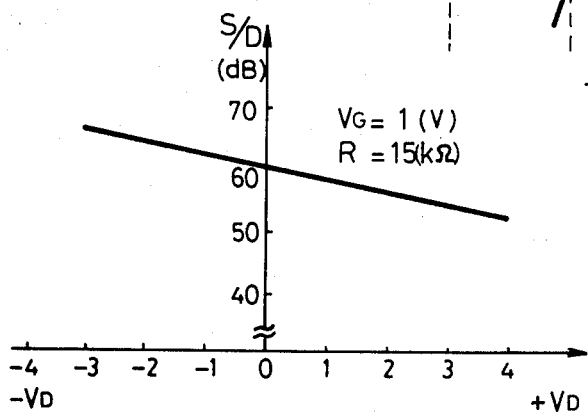

In the case of the variable resistor according to the present invention shown in FIGS. 3 and 4, it has the combined structure comprising a self-aligned gate MIS transistor Q1 and an offset gate type MIS transistor Q2. If the length of the offset region 27 of the transistor Q2 is set at a large value, the pinch-off voltage of the transistor Q2 can be made correspondingly larger, and therefore the linear region of the characteristics of the drain voltage $V_D$ versus drain current $I_D$ could be made larger compared to the conventional device of FIG. 1. FIG. 7 indicates a graph of the S/D(=signal/distortion) characteristics curve versus the drain voltage $V_D$ Accordingly, the variable resistor according to the present invention as shown in FIGS. 3 and 4 has the advantage of having none of the restriction imposed upon the application of the prior art.

Figure 8:
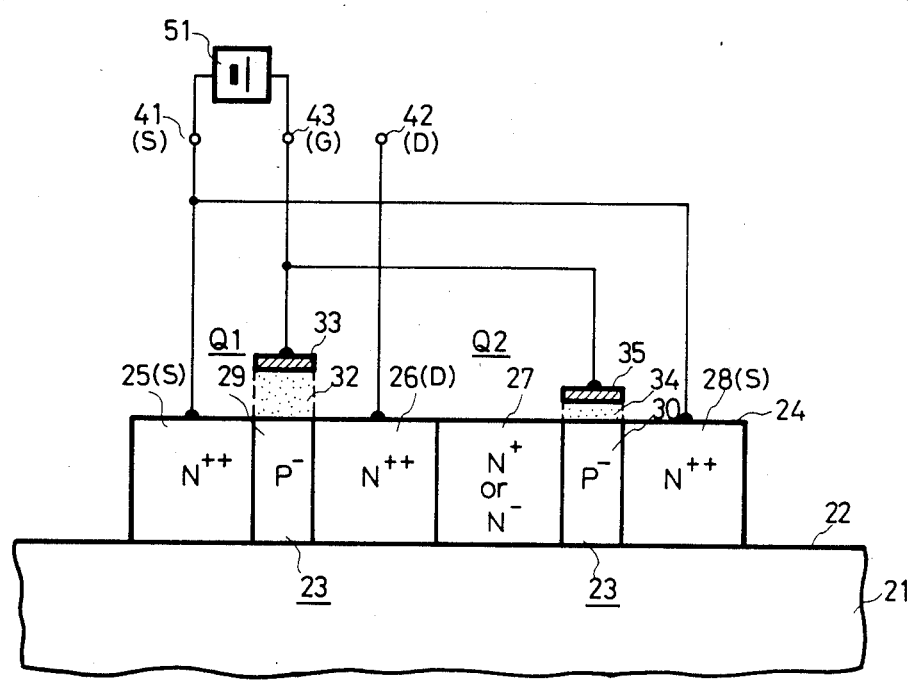
FIG. 8 is a cross sectional view of the structure of another embodiment of the MIS variable resistor according to the present invention.

FIG. 8 shows the cross section of the structure of the second embodiment according to the present invention. In this embodiment the semiconductor regions 25, 26, 27 and 28 are formed as $N^{++}$, $N^{++}$, $N^+$ and $N^{++}$ to construct an N channel MIS transistor. The present invention can be materialized by this embodiment, too.

FIG. 9 briefly shows a manufacturing process of an MIS variable resistor using an N channel type MIS Transistor.

FIG. 9-A shows the steps that $P^-$ type single crystal silicon 50 is ion-implanted with oxygen, an annealing treatment is carried out and then a silicon oxide layer 51 having an insulating property is buried inside the $P^-$ single crystal silicon 50. An $N^-$ type single crystal is epitaxially grown on the thus formed insulating substrate comprising the buried silicon oxide layer 51 and the $P^-$ type single crystal silicon 50, and then is processed to form the $N^-$ type single crystal island 52 of the structure shown in FIG. 9-B. Such structure is then thermally oxydized to form a gate insulated film 53 on which polycrystal silicon 54 and 55 of a predetermined shape are formed to obtain the structure of FIG. 9-C. A masking material 56 is formed in a predetermined shape on the region which is to become an offset gate region and then N type impurities such as phosphor is ion-implanted over the polycrystal silicon 54 and 55 and the masking material 56 used as a mask to form $N^+$ type regions 57, 58 and 59, obtaining the structure of FIG. 9-D. Out of the $N^-$ type single crystal islands, the portion directly below the polycrystal silicon 55 becomes a $N^-$ type region 60, the portion directly below the polycrystal silicon 54 a $N^-$ type region 61 and the portion directly below the masking material 56 a $N^-$ type region 62. The structure shown in FIG. 9-E is obtained by removing the polycrystal silicon 55 and the masking material 56, forming an insulated layer 63 of for example phosphor glass in a thickness greater than that of the gate insulated film 53 to cover the whole portions which were the $N^-$ type single crystal silicon islands. Contact holes on portions of the insulated layers respectively on the $N^+$ type regions 57, 58 and 59 and the polycrystal silicon 54, are formed using a conductive material such as aluminum on the insulated layer 63, processing the aluminum into a predetermined shape to form electrodes 70 to 73 and at the same time forming a gate electrode 74 on the $N^-$ region 60. In the structure shown in FIG. 9-E the $N^+$ region 57 is the drain of the self-aligned gate MIS Transistor, the $N^+$ region 58 the source to be used by both the self-aligned gate MIS Transistor and the offset gate MIS Transistor, the $N^+$ region 59 the drain of the offset gate MIS Transistor and the insulated layer 63 the gate insulated material of the self-aligned gate MIS Transistor.

APPLICATION

Although in the two embodiments mentioned above two transistors Q1 and Q2 use a drain in common to be formed on an insulated substrate, the two transistors Q1 and Q2 do not necessarily use an electrode or a portion thereof in common. The two transistor may be formed separately (independently) to be connected electrically in keeping with the present invention. They may have one common source instead of using a common drain.

Which transister of the two is to be provided with a higher threshold voltage may be determined in design by the character of the transistor.

The threshold voltage may be determined not only by the thickness of the insulated layer as described above but also by the impurity concentration in the channel.

A buried channel MIS transistor which is shown in FIG. 4 or FIG. 9-E, and a surface channel MIS transistor which is shown on the FIG. 8 may also be applied to this invention.

What I claim are:

1. An MIS variable resistor comprising:
   an insulated substrate;
   a self-aligned gate metal insulated semiconductor transistor formed on said substrate, said transistor having a source region, a channel region, a drain region and a gate electrode, said source and drain regions being separated by said channel region with said channel region being proximate said drain region;
   an off-set gate metal insulated semiconductor transistor formed on said substrate, said transistor having a source region, a channel region, a drain region, and a gate electrode, said channel region being between said source and drain regions and said channel region being separated from said drain region by an offset region, said offset region being between said drain region and said channel region and having a resistive layer with a carrier density smaller than that of said drain region;
   said gate electrode, said source and said drain regions of each of said transistors being connected to one another, respectively;
   means for applying a control voltage to said source region and said gate electrodes of said transistors, the absolute threshold gate voltage of said self-aligned gate metal insulated semiconductor transistor being larger than the absolute threshold voltage of said offset gate metal insulated semiconductor transistor, the resistance between said source and drain regions being varied by the control voltage applied to said source and gate regions.

2. An MIS variable resistor comprising:
   an insulated substrate;
   a self-aligned gate metal insulated semiconductor transistor being formed on said substrate, said transistor having a source region, a channel region, a drain region, and a gate electrode, said source and drain regions being separated by said channel region with said channel region being proximate said drain region;

an offset gate metal insulated semiconductor transistor formed on said insulated substrate and having a source region, a channel region, a drain region, and a gate electrode, said channel region being between said source and drain regions and said channel region being separated from said drain region by an offset region, said offset region being between said drain region and said channel region and having a resistive layer with a carrier density smaller than that of said drain region, either said source region or said drain region of said transistors being formed in common;

said gate electrode, said source and said drain regions of each of said transistors being connected to one another respectively;

means for applying a control voltage to said source region and said gate electrodes, the absolute threshold gate voltage of said self-aligned gate metal insulated semiconductor transistor being larger than the absolute threshold voltage of said offset gate metal insulated semiconductor transistor wherein the threshold voltage of the self-aligned gate metal insulated semiconductor transistor is set at a value substantially identical with the gate voltage which minimizes the resistance value between the drain region and the source region of said offset gate metal insulated semiconductor transistor, the resistance between said source region and said drain region being varied by the control voltage applied to said source region and said gate electrode.

3. A voltage controlled MIS variable resistor having improve linearity comprising:

an insulated substrate;

means for establishing a substantially linear resistance versus input voltage characteristic for both positive and negative input voltages, said means including a self-aligned gate metal insulated semiconductor transistor formed on said substrate, said transistor having a source region, a channel region, a drain region and a gate electrode, said source and drain regions being separated by said channel region with said channel region being proximate to said drain region;

an off-set gate metal insulated semiconductor transistor on said substrate, said transistor having a source region, a channel region, a drain region and a gate electrode, said channel region being between said source and drain regions and said channel region being separated from said drain region by an off-set region, said off-set region being between said drain region and said channel region and having a resistive layer with a carrier density smaller than that of said drain region;

said gate electrode, said source and said drain regions of each of said transistors being connected to one another, respectively; and means for applying a control voltage to said source region and said gate electrodes of said transistors, the absolute threshold gate voltage of said self-aligned gate metal insulated semiconductor transistor being larger than the absolute threshold of said off-set gate metal insulated semiconductor transistor, the resistance between said source and drain regions being varied by the control voltage applied to said source and gate regions.

4. The MIS type variable resistor claimed in claim 1 wherein either the source or the drain of said two transistors is formed in common on an insulated substrate.

5. The MIS variable resistor as claimed in claim 4 or 1 wherein said two transistors are composed of different thickness gate insulated films to obtain the different threshold voltages.

6. The MIS variable transistor as claimed in claim 4 or 1 wherein the two transistors are composed of different impurity concentrations in the channel regions to obtain the different threshold voltages.

7. The MIS variable resistor as claimed in claim 1 wherein the MIS transistor is a metal oxide insulated semiconductor transistor.

8. The MIS variable transistor as claimed in claim 7 wherein the threshold voltage of the offset gate MIS transistor is about $-1.4$ V, and the threshold voltage of the self-aligned gate MIS transistor is about $-2.7$ V.

9. The variable resistor of claim 2 further comprising a plurality of said self-aligned gate and off-set gate metal insulated semiconductor transistors formed on said substrate, an off-set gate metal insulated semiconductor transistor being formed between a pair of self-aligned gate metal insulated semiconductor transistors and vice versa, said gate electrode, said source and said drain regions of each of said transistors being connected to one another, respectively.

* * * * *